United States Patent [19]

Ichikawa et al.

[11] Patent Number: 5,213,772
[45] Date of Patent: May 25, 1993

[54] APPARATUS FOR FORMING SILVER HALIDE GRAINS

[75] Inventors: Yasunori Ichikawa; Hiroshi Ohnishi; Shigeharu Urabe; Akira Kojima; Akira Katoh, all of Kanagawa, Japan

[73] Assignee: Fuji Photo Film Co., Ltd., Kanagawa, Japan

[21] Appl. No.: 454,611

[22] Filed: Dec. 21, 1989

[30] Foreign Application Priority Data

Dec. 22, 1988 [JP] Japan .................. 63-322169

[51] Int. Cl.$^5$ .............................. C30B 7/14
[52] U.S. Cl. ...................... 422/245; 422/253; 23/295 R; 423/491; 430/569
[58] Field of Search ............ 422/245, 253; 423/42, 423/491; 23/295 R, 305 R; 430/569

[56] References Cited

U.S. PATENT DOCUMENTS

| 3,132,143 | 5/1964 | Fogagnolo et al. | 422/245 |
| 3,607,392 | 9/1971 | Lauer et al. | 422/245 |
| 3,650,757 | 3/1972 | Irie et al. | 423/491 |
| 3,785,777 | 1/1974 | Porter et al. | 422/253 |
| 3,845,801 | 11/1974 | Kuchar | 23/365 R |
| 4,157,289 | 6/1979 | Ikenoue et al. | 423/491 |
| 4,159,194 | 6/1979 | Steward | 422/245 |
| 4,879,208 | 11/1989 | Urabe | 430/569 |

FOREIGN PATENT DOCUMENTS

| 61-103148 | 5/1986 | Japan | 422/245 |
| 1180038 | 9/1985 | U.S.S.R. | 422/245 |

Primary Examiner—Robert Kunemund
Attorney, Agent, or Firm—Sughrue, Mion Zinn Macpeak & Seas

[57] ABSTRACT

An apparatus for forming silver halide grains comprises a reaction vessel for causing the nucleus formation and the crystal growth of silver halide grains. The apparatus further includes: a mixer disposed outside of the reaction vessel and having a high-speed stirring blade; conduits for supplying an aqueous solution of a water-soluble silver salt, an aqueous solution of water-soluble halide, and an aqueous protective colloid solution to the mixer while controlling the rotational speed of the high-speed stirring blade to form fine, silver halide grains; and a conduit for connecting the mixer to the reaction vessel for immediately supplying the fine grains in the mixer to the reaction vessel.

3 Claims, 3 Drawing Sheets

APPARATUS FOR FORMING SILVER HALIDE GRAINS

FIELD OF THE INVENTION

This invention relates to an apparatus for forming silver halide grains and, more particularly, to an apparatus for forming silver halide grains having a completely homogeneous halide composition in the silver halide crystals and having no halide distribution among the silver halide grains.

BACKGROUND OF THE INVENTION

The formation of silver halide grains is composed of two main steps, a nuclear formation (nucleation) and a crystal growth. In T. H. James, *The Theory of the Photographic Process*, 4th edition, page 89, published by Macmillan Co., 1977, it is disclosed that "[a]lthough crystallization is often considered to consist of two major processes, nucleation and growth, two additional processes occur under some conditions of photographic emulsion precipitation, Ostwald ripening and recrystallization. Nucleation is the process in which there is a population explosion of the number of crystals when entirely new crystals are created. Growth is the addition of new layers to crystals that are already present. Ostwald ripening occurs predominantly at higher temperature, in the presence of solvents, and when there is a wide distribution of grain sizes.—Recrystallization is the process in which the composition of crystals changes." That is, since in the formation of silver halide grains, nuclei are formed at the beginning and the subsequent crystal growth mainly occurs on the existing nuclei only, the number of the silver halide grains does not increase during the growth of the grains.

Silver halide grains are generally produced by reacting an aqueous silver salt solution and an aqueous halide solution in an aqueous colloid solution contained in a reaction vessel. In this case, there is known a single jet process of placing an aqueous solution of a protective colloid, such as gelatin, and an aqueous halide solution in a reaction vessel and adding thereto an aqueous silver salt solution along with stirring for a certain time. Also known is a double jet process of placing an aqueous gelatin solution in a reaction vessel and simultaneously adding an aqueous halide solution and an aqueous silver salt solution each for a certain time. Upon comparing both of the processes with each other, in the double jet process, silver halide grains having a narrower grain size variation are obtained and, further, the halide composition can be desirably changed with the growth of the grains.

Also, it is known that the nucleus formation of silver halide grains is greatly changed by the concentration of silver ions (or halogen ions) in the reaction solutions, the concentration of a silver halide solvent, the supersaturation, the temperature, etc. In particular, the heterogeneity of a silver ion concentration or a halogen ion concentration caused by an aqueous silver salt solution and an aqueous halide solution added to a reaction vessel causes the variation of supersaturation and solubility in the reaction vessel by each concentration, thereby the nucleus formation rate differs to cause a heterogeneity in the silver halide crystal nuclei formed.

In order to avoid the occurrence of the heterogeneity described above, it is necessary to quickly and uniformly mix the aqueous silver salt solution and the aqueous halide solution being supplied to the aqueous colloid solution for homogenizing the silver ion concentration or the halogen ion concentration in the reaction vessel.

In the conventional process of adding an aqueous halide solution and an aqueous silver salt solution to the surface of an aqueous colloid solution in a reaction vessel, the portions having a high halogen ion concentration and a high silver ion concentration occur near the addition locations of the aqueous solutions, which makes it difficult to produce homogeneous silver halide grains. For improving the local deviation of the concentrations, there are known the techniques disclosed in U.S. Pat. Nos. 3,415,650 and 3,692,283 and British Patent No. 1,323,464.

In these processes, a hollow rotary mixer (filled with an aqueous colloid solution and being, preferably, partitioned into upper and lower chambers by a disk-form plate) having slits in the cylindrical walls thereof, is disposed in a reaction vessel filled with an aqueous colloid solution in such a manner that the rotary axis is placed in the direction of gravity. Further, an aqueous halide solution and an aqueous silver salt solution are supplied into the mixer, which is rotating at a high speed, through conduits from the upper and lower open ends and mixed quickly to react the solutions (i.e., when the mixer is partitioned into the upper and lower chambers by a partition disk, the aqueous halide solution and the aqueous silver salt solution supplied to the upper and lower chambers, respectively, are diluted with the aqueous colloid solution filled in both the chambers and then quickly mixed near the outlet slit of the mixer to cause the reaction). The silver halide grains thus formed are discharged into the aqueous colloid solution in the reaction vessel by the centrifugal force caused by the rotation of the mixer to form silver halide grains.

On the other hand, JP-B-55-10545 (the term "JP-B" as used herein means an "examined published Japanese patent application") discloses a technique of improving the local deviation of the concentrations to prevent the occurrence of the heterogeneous growth of silver halide grains. The process is a technique of separately supplying an aqueous halide solution and an aqueous silver salt solution into a mixer filled with an aqueous colloid solution from the lower open end, the mixer being placed in a reaction vessel filled with an aqueous colloid solution, abruptly stirring and mixing the reaction solutions with a lower stirring blade (turbine propeller) provided in the mixer to grow silver halide grains, and immediately discharging the silver halide grains thus grown into the aqueous colloid solution in the reaction vessel from an upper opening of the mixer by means of an upper stirring blade provided in the upper portion of the aforesaid mixer.

Also, JP-A-57-92523 (the term "JP-A" as used herein means an "unexamined published Japanese patent application") discloses a production process of silver halide grains for similarly preventing the occurrence of local heterogeneity of the concentrations. That is, there is disclosed a process of separately supplying an aqueous halide solution and an aqueous silver salt solution into a mixer filled with an aqueous colloid solution from a lower open end, the mixer being disposed in a reaction vessel filled with an aqueous colloid solution. The process further includes diluting both the reaction solutions with the aqueous colloid solution, abruptly stirring and mixing the reaction solutions by a lower stirring blade member provided in the mixer, and immediately discharging the silver halide grains thus grown into the aqueous colloid solution in the reaction vessel from an upper opening of the mixer. As a result, both the reaction solutions, diluted with the aqueous colloid solution as described above, are passed through a gap formed between the inside wall of the aforesaid mixer and the end of a blade of the aforesaid stirring blade member, without passing through gaps between the individual blades of the stirring blade member, so as to abruptly mix the reaction solutions due to the shearing effect in the aforesaid gap and thus cause the reaction to thereby grow silver halide grains.

However, although in the aforesaid processes, the occurrence of the local heterogeneity of the concentrations of silver ions and halogen ions in the reaction vessel can be surely prevented to a considerable extent, the heterogeneity of the concentrations still exists in the mixer and, in particular, a considerably large variation of the concentrations exists near the nozzles for supplying the aqueous silver salt solution and the aqueous halide solution, and near the lower portion and the stirring portion of the stirring blade member. Furthermore, the silver halide grains supplied to the mixer together with the protective colloid are passed through the portions having such a heterogeneous distribution of the concentrations and, more importantly, are rapidly grown in these portions. In other words, in these processes, the variation of the concentrations exists in the mixer and since the grain growth rapidly occurs in the mixer, the purpose of performing a homogeneous nucleus formation and a homogeneous grain growth of silver halide grains in a state having no variation of the concentrations has not been attained.

Furthermore, various attempts have been made for solving the problem of the heterogeneous distribution of the silver ion concentration and the halogen ion concentration by more completely mixing wherein a reaction vessel and a mixer are separately disposed and an aqueous silver salt solution and an aqueous halide solution are supplied to the mixer and abruptly mixed therein to form silver halide grains.

For example, U.S. Pat. No. 4,171,224 and JP-B-48-21045 disclose a process and an apparatus for circulating an aqueous colloid solution (containing silver halide grains) in a reaction vessel at the bottom of the reaction vessel by means of a pump, disposing a mixer in the circulating route, supplying an aqueous silver salt solution and an aqueous halide solution to the mixer, and abruptly mixing both the aqueous solutions in the mixer to form silver halide grains.

Also, U.S. Pat. No. 3,897,935 discloses a process of circulating an aqueous protective colloid solution (containing silver halide grains) in a reaction vessel at the bottom of the reaction vessel by means of a pump and adding an aqueous halide solution and an aqueous silver salt solution into the circulation system.

Furthermore, JP-A-53-47397 discloses a process and an apparatus for circulating an aqueous colloid solution (containing silver halide emulsion) in a reaction vessel by means of a pump, including first adding an aqueous alkali metal halide solution into the circulation system, and after diffusing the solution until the mixture becomes uniform, adding an aqueous silver halide solution into the system followed by a mixing step to form silver halide grains.

However, in these processes, while the flow rate of the aqueous solution being circulated in the reaction vessel and the stirring efficiency of the mixer can be separately changed, and the grain formation can be performed under a condition of a more homogeneous distribution of the concentrations, eventually, the silver halide crystals sent from the reaction vessel together with the aqueous colloid solution cause an abrupt grain growth at the inlet of the aqueous silver salt solution and the aqueous halide solution. Accordingly, it is practically impossible to prevent the formation of the variation of the concentrations at the mixing portion or near the inlets as in the case described above, and thus, the purpose of homogeneously forming silver halide grains in a state having no variation of the concentrations has not yet been attained.

SUMMARY OF THE INVENTION

An object of this invention is to solve the heterogeneities of grain sizes, the crystal habit, the halide distributions among silver halide grains and in the grain, the reduced silver nucleus distribution, etc., caused by the repeated circulation of the silver halide grains, which have already been formed, through a heterogeneous portion formed during the addition of an aqueous silver salt solution and an aqueous halide solution to a protective colloid solution containing silver halide grains in a reaction vessel, which are the disadvantages in the conventional processes. A further object is to provide an apparatus capable of obtaining silver halide grains having very fine grain sizes and a homogeneous grain size distribution, neither of which have been obtained by the conventional processes, by most properly selecting the form of a mixer, the addition locations of aqueous solutions, the form of a stirring blade, etc., such that mixing in the mixer can be efficiently performed for obtaining the homogeneous silver halide grains.

The inventors previously proposed "a process of performing a nucleus formation (nucleation) of silver halide grains" in a reaction vessel by disposing a mixer outside the reaction vessel for causing the nucleus formation and the crystal growth of silver halide grains including the steps of forming silver halide grains, supplying an aqueous solution of a water-soluble halide and an aqueous solution of a water-soluble silver salt into the mixer and mixing them to form silver halide, fine grains, and immediately supplying the fine grains into the reaction vessel (Japanese Patent Application 63-195778). Further, "a process of causing a crystal growth of silver halide grains" in the same manner as above was proposed (Japanese Patent Application 63-7851). The present invention relates to a further improvement of these inventions.

That is, it has been found that the above object can be achieved by the present invention as set forth below.

Thus, the invention provides an apparatus for forming silver halide grains comprising a reaction vessel for causing the nucleus formation (nucleation) and the crystal growth of silver halide grains. The apparatus further includes a mixer disposed outside of the reaction vessel and having a high-speed stirrer, means for supplying an aqueous solution of a water-soluble silver salt, an aqueous solution of water-soluble halide(s), and an aqueous protective colloid solution to the mixer while controlling the rotational speed of the high-speed stirring blade of the mixer, and a conduit for connecting the mixer to the reaction vessel for immediately supplying the product in the mixer to the reaction vessel. An inlet for the aqueous protective colloid solution, being supplied to the mixer, is formed such that it is directed onto the rotary axis of the high-speed stirrer or to an extension line of the rotary axis. The inlets for the aqueous silver salt solution and the aqueous halide solution, being added to the mixer, are formed at the opposite sides of the mixer with respect to each other with the rotary axis extending between them.

BRIEF DESCRIPTION OF THE DRAWINGS

FIGS. 1(a) and (b) are flow diagrams of the systems showing the apparatus of this invention for forming silver halide grains;

DETAILED DESCRIPTION OF THE INVENTION

The term "nuclei", in this invention, means newly forming silver halide grains during the formation of a silver halide emulsion and in a stage of deviating the number of the silver halide crystals, and such silver halide grains which are in a stage of causing only the growth of nuclei, without changing the number of silver halide crystals, are referred to as grains causing the growth only.

In the step of the nucleus formation, the generation of new nuclei, the dissolution of already existing nuclei, and also the growth of nuclei occur simultaneously.

In the practice of the nucleus formation and/or the crystal growth in the invention, it is important that the aqueous silver salt solution and the aqueous halide solution are not added to the reaction vessel, and that the aqueous protective colloid solution (containing silver halide grains) in the reaction vessel is not recycled into the mixer. In these aspects, the present invention is completely different from the conventional systems and is a novel apparatus for obtaining homogeneous silver halide grains.

The mixer and the stirring means of this invention will now be explained.

(1) Mixer:

The features of the mixer for use in this invention are as follows.

(a) The mixer has a plurality of inlets for adding an aqueous silver salt solution, an aqueous halide solution, and an aqueous protective colloid solution for dilution, respectively, as described above.

As the particular aqueous protective colloid solution for dilution, gelatin is generally used and a part of the aqueous gelatin solution may be mixed with the aqueous silver salt solution and the aqueous halide solution for diluting them before these solutions are added to the mixer as will be described below.

(b) In this invention, the inlets for adding the aqueous silver salt solution and the aqueous halide solution to the mixer are disposed, as described above, so that the silver salt and halide solutions are sufficiently diluted with the aqueous gelatin solution in the mixer before they are reacted.

(i) Thus, if the aforesaid conditions are satisfied, the inlets may be disposed at any positions of the mixer (on opposite sides of the mixer), however, it is preferred that the inlets be disposed at the same level as the stir-ring blade or propeller or at the side where the solution is sucked by the rotating blade.

(ii) If the aforesaid dilution of the aqueous silver salt solution and the aqueous halide solution with the aqueous gelatin solution is sufficiently carried out, the inlets of the aqueous silver salt solution and the aqueous halide solution may be arranged at any location so long as they are on opposite sides of the mixer, however, it is preferred that they are disposed at positions symmetric to the rotary axis extending between them.

(iii) The inlet of the aqueous gelatin solution for dilution is disposed at the position, as described above, for uniformly diluting the aqueous solutions before the reaction of the solutions. For instance, the inlet thereof may be directed onto the rotary axis of the stirrer or to an extension line of the axis. So long as the inlet is capable of sufficiently and uniformly diluting the solution before the solutions cause the reaction, the inlet may be disposed at any position. However, it is preferred that the inlet be disposed such that the aqueous gelatin solution is ejected toward the suction region of the rotary blade such as arranging the inlet on the extension line of the rotary axis of the stirrer.

In addition, depending on the location of the outlet of the mixer, the sucking direction of the rotating blade differs and, hence, for diluting the solutions entering the mixer with the aqueous gelatin solution, the inlet of the aqueous gelatin solution must be, as a matter of course, directed to the side being sucked by the rotating blade.

(c) It is necessary that the volume of the reaction chamber of the mixer be small for reducing the residence time of the reaction mixture of the aforesaid solutions to as short as possible. However, there is a restriction on the flow rates of the aqueous silver salt solution and the aqueous halide solution being added to the mixer, namely, the mixer must be so designed that these aqueous solutions so added do not collide with each other, due to the speed at which they are added, before they are diluted with the aqueous gelatin solution.

(d) The inside of the mixer is preferably designed such that a dead space is not formed therein by the addition of an aqueous silver salt solution, an aqueous halide solution, and an aqueous gelatin solution for dilution. The formation of the dead space is also influenced by the form of the stirring blade (the stirring direction of the blade) and, hence, the form of blade must be carefully designed.

(e) The position of the outlet on the reaction chamber of the mixer is preferably designed such that the solutions, after finishing the reaction, are uniformly mixed and are discharged therefrom without giving a residence time variation. For this purpose, an effective construction is to have the liquid be discharged through a narrow space formed between the axis of the stirrer and a partition plate formed in the chamber.

(2) Stirring Means:

The features of the stirring means employed in this invention are as follows.

(a) The rotation number (r.p.m.) of the stirring means is preferably as high as possible. Also, it is necessary to be able to control the rotation number.

(b) In the case of using fine silver halide grains for the grain growth in this invention, the finer the grain sizes are, the shorter the dissolution time will be, but it is clear that the grain sizes of the fine grains formed change according to the compositions of the aqueous solutions being added to the mixer. By controlling the rotation number of the stirring means in conformity with the compositions of the solutions, the grain sizes of the fine grains formed are controlled.

(c) The particular form of the stirring blade is optional, but a stirring blade meeting the following conditions is preferred.

(i) The stirring blade must be capable of being rotated at a high speed.

(ii) The stirring blade does not require too much power even during high speed rotation.

(iii) The liquid flow is easily created in the circumferential direction in the chamber by the stirring.

Figures 1A, 1B:
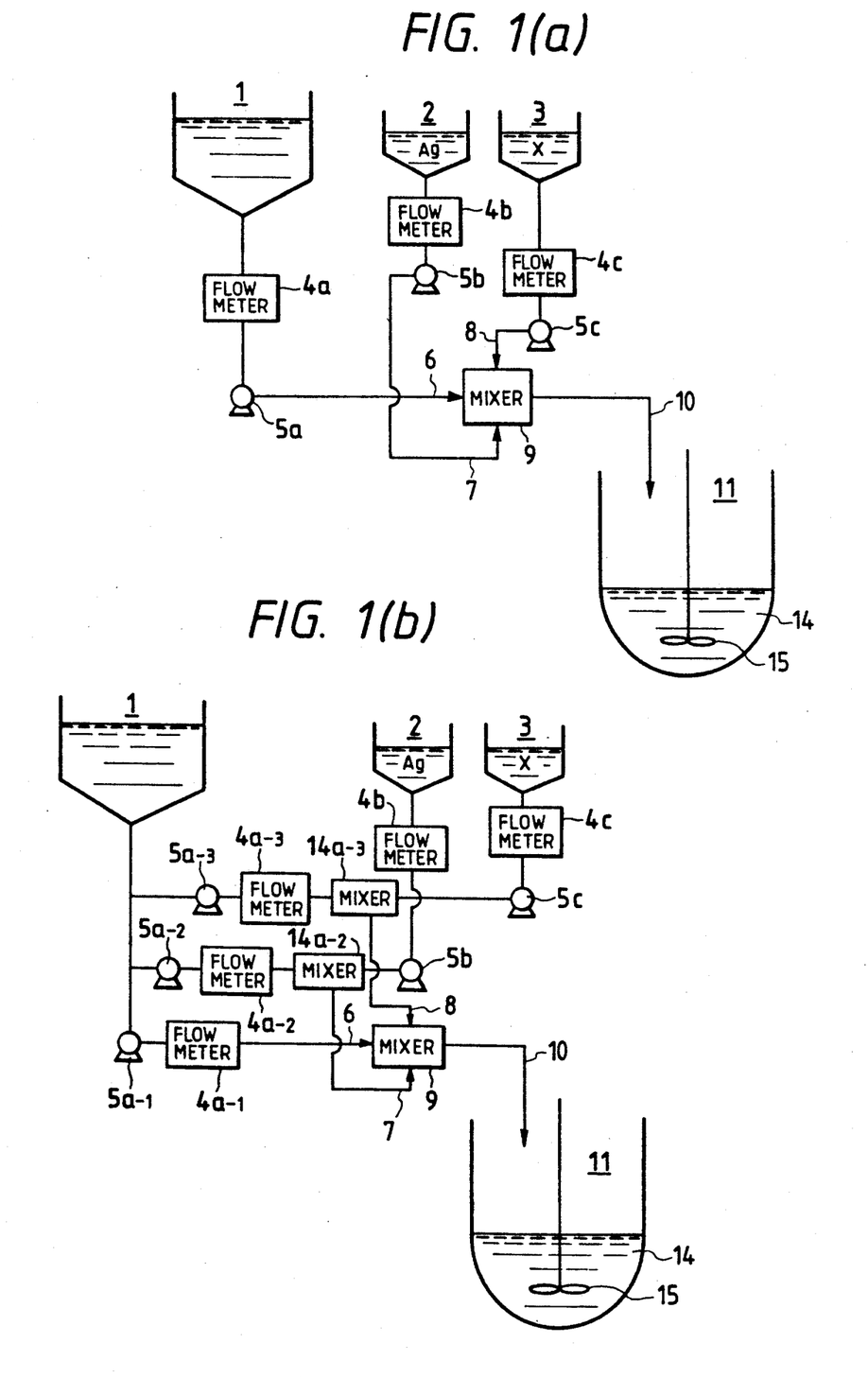

FIG. 1(a) is a fluid flow diagram showing an embodiment of the apparatus of this invention.

An aqueous protective colloid solution, an aqueous silver salt solution, and an aqueous halide solution prepared in tanks 1, 2, and 3, respectively, are supplied by pumps 5a, 5b, and 5c while the flow rates of these solutions are measured by flow meters 4a, 4b, and 4c for controlling the flow rates of the pumps 5a, 5b, and 5c, respectively. The mixer 9 is equipped with a stirrer (as will be described below in detail), and the aforementioned three solutions are mixed in the mixer while controlling the rotation number of the blade (propeller) of the stirrer to form silver halide, fine grains in the mixer 9. The fine grains are immediately supplied into a reaction vessel 11, and the nucleus formation and/or the crystal growth of the silver halide grains in the reaction vessel 11 are performed.

In this case, the flow rates of the aqueous silver salt solution and/or the aqueous halide solution, and the aqueous protective colloid solution are controlled by the pumps 5a, 5b, and 5c, respectively, such that fine grains having the desired characteristics are formed in the mixer 9.

Also, the invention may have the system flow diagram as shown in FIG. 1(b).

In this system, a portion of an aqueous protective colloid solution prepared in a tank 1 is directly supplied to a mixer 9, while the remainder of the aqueous protective colloid solution is divided into two portions, each for diluting an aqueous silver salt solution prepared in a tank 2 or an aqueous halide solution prepared in a tank 3 before supplying the solutions to the mixer 9. The flow rates of the three portions of the aqueous protective solution are measured by flow meters 4a-1, 4a-2, and 4a-3, respectively, the flow rates thereof are controlled by pumps 5a-1, 5a-2, and 5a-3, respectively, and the aqueous silver salt solution and the aqueous halide solution are diluted with the aqueous protective colloid solution in mixers 14a-2 and 14a-3, respectively, before being supplied to the mixer 9. In this case, the flow rates of the aqueous solutions are controlled by pumps 5a-1, 5a-2, 5a-3, 5b, and 5c such that fine, silver halide grains are formed under a definite condition in the mixer 9. Also, the flow rates of the aqueous protective colloid solution for diluting the aqueous silver salt solution and the aqueous halide solution as measured by the flow meters 4a-2 and 4a-3 are controlled in conformity with the control of the aqueous silver salt solution and the aqueous halide solution in the system shown in FIG. 1(b).

Next, the manner of forming silver halide grains by the apparatus of this invention is shown by referring to FIG. 1.

In FIGS. 1(a) and 1(b), the reaction vessel 11 contains an aqueous protective colloid solution 14. The aqueous solution is stirred by a propeller or blade 15 disposed on a rotary shaft. An aqueous silver salt solution, an aqueous halide solution, and an aqueous protective colloid solution are supplied to a mixer 9 disposed outside of the reaction vessel 11 by the addition systems or conduits 7, 8, and 6, respectively. In this case, the aqueous silver salt solution and the aqueous halide solution may be supplied to the mixer after being diluted with the aqueous protective colloid solution as shown in FIG. 1(b).

These solutions are quickly and strongly mixed in the mixer and silver halide fine grains thus formed are immediately introduced into the reaction vessel 11 by a system or conduit 10.

Figure 2:
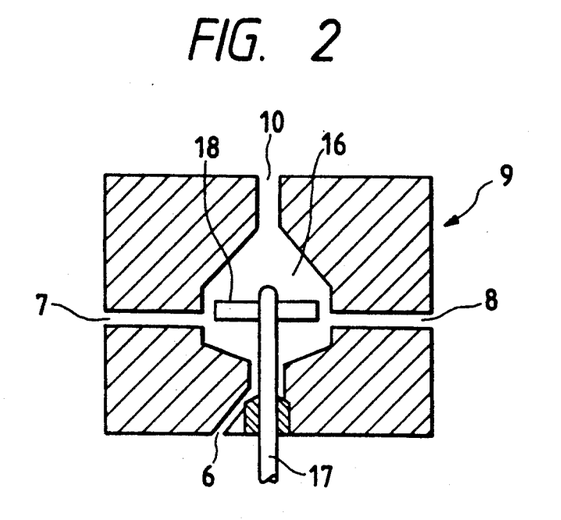
FIG. 2 is a cross-sectional view of an embodiment of the mixer for use in this invention.

FIG. 2 shows the details of an embodiment of the mixer for use in this invention. The mixer 9 has a reaction chamber 16 on the inside and is equipped with a stirrer composed of a rotary shaft 17 and a stirring blade 18 disposed thereon.

Inlet conduits 7 and 8 of the aqueous silver salt solution and the aqueous halide solution are disposed at opposite sides to one another with respect to the rotary shaft 17 of the high-speed stirrer 18. The inlet conduit 6 (not shown in FIG. 2) for the aqueous protective colloid solution is directed onto the rotary axis 17 of the stirrer 18 so that both of the solutions ejected from the inlet conduits 7 and 8 are diluted with the aqueous colloid solution before they are reacted with each other, and these solutions are added to the reaction chamber 16 from the inlets.

By rotating the rotary shaft at a high speed (higher than about 1000 r.p.m., preferably higher than 2000 r.p.m., and more preferably higher than 3000 r.p.m.), the solution containing very fine grains formed by quickly and strongly mixing the solutions is immediately discharged therefrom through an outlet conduit 10 and introduced into the aforesaid reaction vessel.

After being introduced into the reaction vessel 11, the very fine grains formed in the mixer 9 are easily dissolved owing to the fineness of the grain sizes and cause a homogeneous nucleus formation and/or a crystal growth with a very slight portion of the fine grains serving as seed crystals.

The halide composition of the very fine grains is selected to be the same as the halide composition of the desired silver halide grains.

The fine grains introduced into the reaction vessel 11 are dispersed in the solution in the reaction vessel by stirring in the reaction vessel and halogen ions and silver ions of the desired halide composition are released from each fine grain.

The size of the grains formed in the mixer 9 is very fine, the number of the grains is very large, and since the silver ions and halogen ions (in the case of growing mixed crystals, the composition of the halogen ions is the same as the desired halogen ion composition) are released from such a large number of grains and the release of these ions occurs throughout the entire protective colloid solution in the reaction vessel, a complete nucleus formation and crystal growth is obtained.

In this case, it is important that the silver ions and the halogen ions are not added to the reaction vessel 11 as aqueous solutions, and that the aqueous protective colloid solution in the reaction vessel 11 is not recycled into the mixer 9.

With respect to the aforesaid point, the apparatus of this invention is completely different from conventional apparatus for forming silver halide grains and can have an astonishing effect on the nucleus formation and the crystal growth of silver halide grains.

The fine grains formed in the mixer have a very high solubility since the grain sizes of the grains are very fine and thus are easily dissolved to form silver ions and halogen ions again when they are added to the reaction vessel. Hence, these ions are precipitated on a very slight part of the remaining fine grains thus introduced into the reaction vessel to form silver halide nuclei and to accelerate the crystal growth, but the fine grains together cause so-called Ostwald ripening due to the high solubility to increase the grain sizes.

In this invention, the occurrence of Ostwald ripening is prevented by disposing a mixer at a position very near the reaction vessel and shortening the residence time of the added solutions in the mixer, that is, by immediately adding the fine grains formed in the mixer to the reaction vessel. Practically, the residence time t of the solutions added to the mixer is shown by the following equation:

$$t = \frac{V}{a+b+c}$$

V: Volume (ml) of the reaction chamber of the mixer.
a: Addition amount (ml/min.) of an aqueous silver nitrate solution.
b: Addition amount (ml/min.) of an aqueous halide solution.
c: Addition amount (ml/min.) of an aqueous protective colloid solution.

(In this invention, however, the amount c contains the amount of the aqueous protective colloid solution previously used for diluting the aqueous silver nitrate solution and the aqueous halide solution.)

In the apparatus of this invention, the residence time t is not longer than 10 minutes, preferably not longer than 5 minutes, more preferably not longer than 1 minute, and particularly preferably not longer than 20 seconds. The fine grains thus obtained in the mixer are immediately added to the reaction vessel without increasing the grain size.

From the aforesaid viewpoint, the control of the flow rates of an aqueous silver salt solution, an aqueous halide solution, and an aqueous protective colloid solution plays an important role in this invention. One of the features of this invention is in this aspect, namely the flow rate of the sum of the aforesaid addition amounts a, b, and c is controlled while keeping the ratios of them constant.

The solutions are stirred strongly and efficiently in the mixer.

In T. H. James, *The Theory of the Photographic Process*, page 93, he discloses that "[a]nother mode ranking with Ostwald ripening is coalescence ripening. In coalescence ripening, crystals which were previously far apart are directly brought into contact with each other and adhere to each other to form larger crystals, thereby the grain sizes suddenly change. Both coalescence ripening and Ostwald ripening occur not only after finishing the deposition but also during the deposition."

The coalescence ripening described above is liable to occur when the grain sizes are very small and is liable to occur when stirring is insufficient. In the extreme case, the silver halide grains sometimes form coarse, massive grains. On the other hand, in this invention, since a closed type mixer as shown in FIG. 2 is used, the stirring blade in the reaction chamber can be rotated at a high rotational speed. High speed stirring has never been practiced in the conventional open type reaction vessel (in the open type reaction vessel, when a stirring blade is rotated at a high rotational speed, the liquid in the vessel is scattered away and foam is formed by centrifugal force, which makes it practically impossible to use such a system). The present invention prevents the occurrence of the aforesaid coalescence ripening, thereby allowing silver halide grains having very fine grain sizes to be obtained.

In this invention, the rotation number or speed of the stirring blade is at least 1,000 r.p.m., preferably at least 2,000 r.p.m., and more preferably at least 3,000 r.p.m.

Accordingly, the control of the rotation number of the stirring blade in the mixer plays an important role.

Injection of an aqueous protective colloid solution into the mixer.

The occurrence of the aforesaid coalescence ripening can be remarkably prevented by a protective colloid for the fine, silver halide grains. In this invention, the aqueous protective colloid solution is added to the mixer by the following method.

(a) The aqueous protective colloid solution is separately added to the mixer.

The concentration of the protective colloid is at least 0.2% by weight, and preferably at least 0.5% by weight and the flow rate of the aqueous protective colloid solution is at least 20%, preferably at least 50%, and more preferably at least 100% of the sum of the flow rate of the aqueous silver nitrate solution and the flow rate of the aqueous halide solution being added to the mixer. In the present invention, this method is employed.

(b) The protective colloid is contained in the aqueous halide solution being added to the mixer.

The concentration of the protective colloid is at least 0.2% by weight, and preferably at least 0.5% by weight.

(c) The protective colloid is contained in the aqueous silver nitrate solution being added to the mixer.

The concentration of the protective colloid is at least 0.2% by weight, and preferably at least 0.5% by weight. When gelatin is used as a protective colloid, since gelatin silver may be formed from silver ions and gelatin if the mixture is stored for a long time and silver colloid may be formed by the photodecomposition and/or the thermal decomposition thereof, it is preferred to mix the aqueous silver salt solution and the aqueous gelatin solution directly before use.

Also, as to the aforesaid methods (a), (b), and (c), the method (a) may be used singly, a combination of the methods (a) and (b) or the methods (a) and (c), or a combination of the methods (a), (b), and (c) may be used.

In this invention, gelatin is usually used as the protective colloid but other hydrophilic colloids can also be used. Practically, the hydrophilic colloids which can be used in this invention are described in *Research Disclosure*, Vol. 176, No. 17643, Paragraph IX (December, 1978).

The grain sizes obtained by the aforesaid techniques can be observed by a transmission type electron microscope on a mesh and in this case, the magnification is from 20,000 to 40,000 magnifications.

The sizes of the fine grains obtained by the process of this invention are not larger than 0.06 μm, preferably not larger than 0.03 μm, and more preferably not larger than 0.01 μm.

U.S. Pat. No. 2,146,938 discloses a method of forming a coarse grain silver halide emulsion by mixing coarse silver halide grains having adsorbed thereto no absorptive material and fine, silver halide grains, having adsorbed thereto no adsorptive material or by slowly adding a fine grain silver halide emulsion to a coarse grain silver halide emulsion. In the method, the fine grain emulsion previously prepared is added and thus the method is completely different from the present invention.

Also, U.S. Pat. No. 4,379,837 discloses a process of growing silver halide grains by washing and dispersing a fine grain silver halide emulsion prepared in the presence of a grain growing inhibitor, re-dissolving the emulsion, and adding the dissolved emulsion to silver halide grains being grown. But the process is also completely different from the present invention for the same reason as described above.

T. H. James, *The Theory of the Photographic Process*, 4th edition cites a Lippmann emulsion as a fine grain silver halide emulsion and describes that the mean grain size is 0.05 μm. It is possible to obtain fine silver grains having a mean size of not larger than 0.05 μm, but even if such fine grains are obtained, the grains are unstable and the grain sizes are easily increased by Ostwald ripening. When an adsorptive material is adsorbed on fine grains as in the process disclosed in U.S. Pat. No. 4,379,837, the occurrence of Ostwald ripening may be prevented to some extent, but the dissolution speed of the fine grains is reduced by the presence of the adsorptive material, which is contrary to the intention of this invention.

U.S. Pat. Nos. 3,317,322 and 3.206,313 disclose a process of forming core/shell grains by mixing a chemically sensitized emulsion of silver halide grains having a mean grain size of at least 0.8 μm which are to be the cores, with an emulsion of silver halide grains which are not chemically sensitized and which have a mean grain size of not larger than 0.4 μm, to perform the ripening. However, the process is completely different from the present invention since in the aforesaid process, the fine grain emulsion is a silver halide emulsion previously prepared and ripening is performed by mixing two kinds of silver halide emulsions.

JP-A-62-99751 discloses a photographic element containing tabular silver bromide or silver iodobromide emulsion having a mean grain size of from 0.4 to 0.55 μm and having an aspect ratio of at least 8. Also, U.S. Pat. No. 4,672,027 discloses a photographic element containing tabular silver bromide or silver iodobromide emulsion having a mean grain size of from 0.2 to 0.55 μm, but in the growth of tabular silver iodobromide grains described in the examples, the tabular silver iodobromide grains are grown by adding an aqueous silver nitrate solution and an aqueous bromide solution to a reaction vessel containing an aqueous solution of a protective colloid (bone gelatin) by a double jet method and simultaneously supplying iodine as a silver iodide emulsion (mean grain size of about 0.05 μm, bone gelatin 40 g/mol-Ag). In the process, an aqueous silver nitrate solution and an aqueous halide solution are added to a reaction vessel simultaneously with the addition of silver halide, fine grains and, hence, the process is completely different from the present invention.

In U.S. Pat. No. 4,457,101, it is disclosed that "silver, a bromide, and an iodide can be introduced at the beginning or in the growing state as a form of fine silver halide grains dispersed in a dispersion medium. That is, silver bromide grains, silver iodide grains and/or silver iodobromide grains can be introduced."

However, the above description is only a general description of using a fine grain emulsion for the formation of silver halide and does not show the system of the present invention.

JP-A-62-124500 discloses an example of growing host grains in a reaction vessel using very fine, silver halide grains previously prepared, but in that process, a fine grain silver halide emulsion previously prepared is added and, hence, the process is completely different from the present invention.

In the conventional techniques described above, since a fine grain silver halide emulsion is previously prepared and the emulsion is re-dissolved for use, silver halide grains having fine grain sizes cannot be obtained. Accordingly, these grains having relatively large grain sizes cannot be quickly dissolved in a solution in a reaction vessel, a very long period of time or a large amount of silver halide solvent is required for completing the dissolution thereof. In such a circumstance, the nucleus formation is performed at a very low supersaturation for the grains being grown in a vessel, which results in greatly broadening the grain size variation of the nuclei and thus causing the reduction of properties such as the broadening of the grain size variation of silver halide grains formed, the reduction of the photographic gradation, the reduction of sensitivity by the heterogeneous chemical sensitization (it is impossible to most suitably chemically sensitize silver halide grains having large grain sizes and silver halide grains having small grain sizes simultaneously), the increase of fog, the deterioration of graininess, etc.

Furthermore, in the conventional techniques, there are many steps of grain formation, washing, dispersion, cooling, storage, and re-dispersion, thereby the production costs become high, and also there are many restrictions on the addition system of an emulsion as compared with the addition system of other solutions.

These problems can be solved by the apparatus of this invention. That is, since very fine grains are introduced into the reaction vessel by the apparatus of this invention, the solubility of the fine grains is high, thereby the dissolution rate is high and the grains being grown in the reaction vessel result in nucleus formation and/or crystal growth under a high super-saturation condition. Accordingly, the size distribution of the nuclei and/or the crystal grains formed is not broadened. Furthermore, since the fine grains formed in the mixer are added to the reaction vessel as disclosed there is no problem with the production cost.

When the silver halide solvent is used in the reaction vessel of this invention, a far higher dissolution rate of fine grains and a far higher nucleation rate and crystal growing rate of grains in the reaction vessel is obtained.

As a silver halide solvent, there are a water-soluble bromide, a water-soluble chloride, a thiocyanate, ammonia, a thioether, a thiourea, etc.

For example, there are thiocyanates (described in U.S. Pat. Nos. 2,222,264, 2,448,534, and 3,320,069), ammonia, thioether compounds (described in U.S. Pat. Nos. 3,271,157, 3,574,628, 3,704,130, 4,297,439 and 4,276,345), thione compounds (described in JP-A-53-144319, 53-82408, and 55-77737), amine compounds (described in JP-A-54-100717), thiourea derivatives (described in JP-A-55-2982), imidazoles (described in JP-A-54-100717), and substituted mercaptotetrazoles (described in JP-A-57-202531).

In the apparatus of this invention, the supplying rates of silver ions and halide ions to the mixer may be controlled. The supplying rates may be constant, but it is preferred to gradually increase the supplying rates. Such methods are described in JP-B-48-36890 and U.S. Pat. No. 3,672,900.

Furthermore, in the apparatus of this invention, the halogen composition during the crystal growth may be controlled. For example, in the case of silver iodobromide, it is possible to maintain a definite content of silver iodide, continuously increase the content of silver iodide, continuously decrease the content of silver iodide, or change the content of silver iodide after a certain time.

The reaction temperature in the mixer is not higher than 60° C., preferably not higher than 50° C., and more preferably not higher than 40° C.

With a reaction temperature of lower than about 35° C., ordinary gelatin is liable to coagulate and it is preferred to use a low molecular weight gelatin (mean molecular weight of less than about 30,000).

Such a low molecular weight gelatin, which is preferably used in this invention, can usually be prepared as follows. Ordinary gelatin having a mean molecular weight of about 100,000 is dissolved in water and then the gelatin molecule is enzyme-decomposed by adding thereto a gelatin decomposing enzyme. For the method, the description of R. J. Cox, *Photographic Gelatin II*, pages 233-251 and 335-346, Academic Press, London 1976 can be referred to.

In this case, since the bonding position of gelatin decomposed by the enzyme occurs at a specific structural position, low molecular weight gelatin having a relatively narrow molecular weight distribution is obtained. In this case, as the enzyme decomposition time is longer, a lower molecular weight of gelatin is obtained.

In another method of obtaining low molecular weight gelatin, ordinary gelatin is hydrolyzed by heating at low pH (e.g., pH 1 to 3) or high pH (e.g., pH 10 to 12).

The temperature of the protective colloid in the reaction vessel is higher than about 40° C., preferably higher than 50° C., and more preferably higher than about 60° C.

In this invention, an aqueous silver salt solution and an aqueous halide solution are not added to the reaction vessel during the nucleus formation and/or the crystal growth, but prior to the nucleus formation, an aqueous halide solution or an aqueous silver salt solution can be added to the reaction vessel for controlling pAg of the solution in the reaction vessel. Also, an aqueous halide solution or an aqueous silver salt solution can be added (temporarily or continuously) to the reaction vessel for controlling pAg of the solution in the reaction vessel during the formation of nuclei. Also, if necessary, an aqueous halide solution or an aqueous silver salt solution can be added to the reaction vessel by a so-called pAg control double jet method for keeping constant pAg of the solution in the reaction vessel.

The apparatus of this invention is very effectively used for the production of various kinds of emulsions.

In the nucleus formation and/or the grain growth of mixed crystal silver halide grains such as silver iodobromide, silver iodobromo-chloride, silver iodochloride, and silver chlorobromide, a microscopic heterogeneity of a halide composition is formed in the case of conventional production techniques. Further, the occurrence of such a heterogeneity cannot be avoided even by performing the nucleus formation and/or the crystal growth by adding an aqueous halide and an aqueous silver salt solution of a constant halide composition to the reaction vessel. The microscopic heterogeneous distribution of halide can be easily confirmed by observing the transmitted images of the silver halide grains using a transmission type electron microscope.

For example, the microscopic heterogeneous distribution can be observed by the direct method using a transmission type electron microscope at low temperature described in J. F. Hamilton, *Photographic Science and Engineering*, Vol. II, 57(1967) and Takekimia Shiozawa, *Journal of the Society of Photographic Science and Technology of Japan*, Vol. 35, No. 4, 213(1972). That is, silver halide grains released from a silver halide emulsion under a safe light such that the silver halide grains are not printed out are placed on a mesh for electron microscopic observation and the grains are observed by a transmission method in a state of being cooled by liquid nitrogen or liquid helium for preventing the silver halide grains from being damaged (printed out) by electron rays.

In this case, the higher the acceleration voltage of the electron microscope is, a clearer transmitted image is obtained, but it is preferred that the voltage be about 200 kvolts up to a thickness of the silver halide grains of about 0.25 μm and be about 1,000 kvolts up to a thickness of thicker than 0.25 μm. Since the higher the acceleration voltage is, the greater the damage to the grains by the irradiated electron rays will be, it is preferred that the sample being observed is cooled by liquid helium as opposed to liquid nitrogen.

The photographing magnification can be properly changed by the grain sizes of the sample being observed, but is usually from 20,000 to 40,000 magnifications.

In silver halide grains composed of a simple halide, there cannot be, as a matter of course, a heterogeneity in the halide distribution and hence only flat images are obtained in the transmission type electron microphotograph. On the other hand, in the case of mixed crystals composed of plural halides, a very fine annular ring-form striped pattern is observed.

For example, in the transmission type electron microphotograph of tabular silver iodobromide grains, a very fine annular ring-like striped pattern is observed at the portion of the silver iodobromide phase. The tabular grains were formed by using tabular silver bromide grains as the cores and forming a shell of silver iodobromide containing 10 mol % silver iodide on the outside of the core, and the structure thereof can be clearly observed by the transmission type electron microphotograph. That is, since the core portion is silver bromide and, as a matter of course, homogeneous, a homogeneous flat image only is obtained in the core portion. On the other hand, in the silver iodobromide phase, a very fine annular striped pattern can clearly be observed.

The interval of the striped pattern is very fine, e.g., along the order of 100 Å or lower, which shows a very microscopic heterogeneity.

It can be clarified by various methods that the very fine striped pattern shows the heterogeneity of a halide distribution, but in a direct method, it can be concluded that when the grains are annealed under the condition capable of moving iodide ions in the silver halide crystal (e.g., for 3 hours at 250° C.), the striped pattern completely vanishes.

No annular striped pattern is observed in the tabular silver halide grains prepared by using the apparatus of this invention and silver halide grains having a completely homogeneous silver iodide distribution is obtained in this invention. The site of the phase containing silver iodide in the grains may be the center of the silver halide grain, may be present throughout the whole grain, or at the outside of the grain. Also, the phase wherein silver iodide exists may be one or plural.

Details of these techniques are described in Japanese Patent Applications 63-7851, 63-7852, and 63-7853. These inventions relate to the growth of grains, but the same effect is also apparent in the nucleus growth in this invention.

The silver iodide content in the silver iodobromide phase or the silver iodochloride phase contained in the silver halide grains produced by this invention is from 2 to 45 mol %, and preferably from 5 to 35 mol %. The total silver iodide content is at least 2 mol %, more preferably at least 7 mol %, and particularly preferably at least 12 mol %.

The apparatus of this invention is useful in the production of silver chlorobromide grains, and silver chlorobromide grains having completely homogeneous silver bromide (silver chloride) distribution can be obtained. In this case, the content of chloride is at least 10 mol %, and preferably at least 20 mol %.

Furthermore, the apparatus of this invention is also very effectively used for the production of pure silver bromide or pure silver chloride. According to a conventional production technique, the existence of a local variation of silver ions and halogen ions in a reaction vessel is unavoidable, the silver halide grains in the reaction vessel are brought into a different circumstance with respect to other portions by passing through such a locally heterogeneous portion. Hence, not only the heterogeneity of the grain growth occurs, but also reduced silver or fogged silver is formed in, for example, a highly concentrated portion of silver ions. Accordingly, in silver bromide or silver chloride, the occurrence of the heterogeneous distribution of the halide cannot take place, but another form of heterogeneity, as described above, occurs.

This problem is completely solved by the present invention.

The silver halide grains obtained by using the apparatus of this invention can be, as a matter of course, used for a surface latent image type silver halide emulsion and can be also used for an inside latent image forming type emulsion and a direct reversal emulsion.

In general, the inside latent image forming type silver halide grains are superior to surface latent image forming type silver halide grains in the following aspects.

(1) A space charge layer is formed in silver halide crystal grains, electrons generated by light absorption move to the inside of the grain, and positive holes move to the surface. Accordingly, if latent image sites (electron trap sites), i.e., sensitive specks, are formed in the side of the grains, the occurrence of the recombination of the electron and the positive hole is prevented, thereby the latent image formation is performed at a high efficiency and a high quantum sensitivity is realized.

(2) Since the sensitive specks exist in the interior of the grains, the silver halide grains are not influenced by moisture and oxygen, and thus are excellent in storage stability.

(3) Since the latent images formed by light exposure exist in the interior of the grains, the latent images are not influenced by moisture and oxygen, and the latent image stability is also very high.

(4) When the silver halide emulsion is color or spectrally-sensitized by absorbing one or more sensitizing dyes on the surface of the silver halide grains of the emulsion, the light absorption sites (i.e., the one or more sensitizing dyes on the surface of the grains) are separated from the interior latent image sites. Thus, the recombination of the dye positive holes and electrons is inhibited to prevent specific desensitization of the color sensitization, and a high color-sensitized sensitivity is thereby realized.

The inside latent image formation type silver halide grains have the aforementioned advantages as compared to surface latent image formation type silver halide grains. However, the silver halide grains have difficulty in the formation of sensitive specks in the interior of the grains. For forming sensitive specks in the interior of silver halide grains, after once forming silver halide grains as core grains, a chemical sensitization is applied to the grains to form sensitive specks on the core surfaces. Thereafter, silver halide is precipitated on the cores to form so-called shells thereon. However, the sensitive specks on the surface of the core grains obtained by the chemical sensitization of the cores are liable to change at the formation of the shells and are liable to frequently form inside fog. One of the reasons for this is that if the shell formation on the cores occurs at the heterogeneous portion of concentrations (silver ion concentration and halogen ion concentration) as in a conventional technique, the shells are damaged and the sensitive specks are liable to be changed into fogged nuclei. On the other hand, according to this invention, the aforesaid problem is solved and an inside latent image forming type silver halide emulsion having much less inside fog is obtained.

For the inside latent image forming type silver halide grains, normal crystal grains and tabular grains are preferred, and the silver halide thereof is silver bromide, silver iodobromide and silver chlorobromide or silver chloroiodo-bromide having a silver chloride content of less than 30 mol % and is preferably silver iodobromide having a silver chloride content of less than 10 mol %.

In this case, the mol ratio of core/shell may be optional, but is preferably from 1/20 to ½, and more preferably from 1/10 to ⅓.

Also, in place of the inside chemically sensitized nuclei, a metal ion can be doped to the inside of the grains with the nuclei. The doping site may be the core, the core/shell interface, or the shell.

As the metal dopant, cadmium salts, lead salts, thalium salts, erbium salts, bismuth salts, iridium salts, rhodium slats or the complex salts thereof can be used. The metal ions are usually used in an amount of at least $10^{-6}$ mol per mol of silver halide.

The silver halide nucleus grains obtained by using the apparatus of this invention further grow into silver halide grains having the desired grain size and a desired halide composition by performing the grain growth thereafter.

When the silver halide being grown is, in particular, mixed crystals such as silver iodobromide, silver iodochloro-bromide, silver chlorobromide, or silver iodochloride, it is preferred to perform the grain growth by the process of this invention in succession to the formation of the nuclei.

Also, if necessary, it is preferred to perform the grain growth by adding a previously prepared fine grain silver halide emulsion to the reaction vessel. The details of the process are described in Japanese Patent Applications 63-7851, 63-7852, and 63-7853.

The silver halide grains thus obtained by using the apparatus of this invention have the "completely homogeneous" halide distribution in both the nuclei and the grown phases of the grains and also the grain size variation thereof is very small.

There is no particular restriction on the mean grain size of the completely homogenous silver halide grains obtained by the process of this invention, but the mean grain size is preferably at least 0.3 μm, more preferably at least 0.8 μm, and particularly preferably at least 1.4 μm.

The silver halide grains obtained using the apparatus of this invention may have a regular crystal from (normal crystal grains) such as hexahedral, octahedral, dodecahedral, tetradecahedral, tetracosahedral, and octacontahedral, an irregular crystal form such as spherical and potato-form, or various forms having at least one twin plane, in particular, hexagonal tabular twin grains or triangular tabular twin grains having two or three parallel twin planes.

The silver halide photographic emulsion obtained by using the apparatus of this invention can be used for various silver halide photographic materials and various additives, the photographic processing process thereof, etc., are described in JP-A-63-123042, 63-106745, 63-106749, 63-100445, 63-71838, 63-85547, Vol. 187, No. 18716.

The particular portions of the Research Disclosures (RD) are shown in the following table.

| Additive | RD 17643 | RD 18716 |
| --- | --- | --- |
| 1. Chemical Sensitizer | p. 23 | p. 648, right column |
| 2. Sensitivity Increasing Agent | | p. 648, right column |
| 3. Spectral Sensitizer, | pp. 23-24 | p. 648, right column |
| Super Color Sensitizer | | p. 649 right column |
| 4. Whitening Agent | p. 24 | |
| 5. Antifoggant and Stabilizer | pp. 24-25 | p. 649, right column |
| 6. Light Absorber, Filter Dye, Ultraviolet Absorber | pp. 25-26 | p. 649, right column-p. 650, left column |
| 7. Stain Inhibitor | p. 25, to right columns | p. 650, left col. |
| 8. Dye Image Stabilizer | p. 25 | |
| 9. Hardening Agent | p. 26 | p. 651, left column |
| 10. Binder | p. 26 | p. 651, left column |
| 11. Plasticizer, Lubricant | p. 27 | p. 650, right column |
| 12. Coating Aid, Surface Active Agent | pp. 26-27 | p. 650, right column |
| 13. Antistatic Agent | p. 27 | p. 650, right column |
| 14. Color Coupler | p. 28 | pp. 647-648 |

Examples of the structure of the reaction chamber of the mixer and the stirrer of the mixer in the apparatus of this invention will now be explained by referring to the accompanying drawings.

Figure 3A:
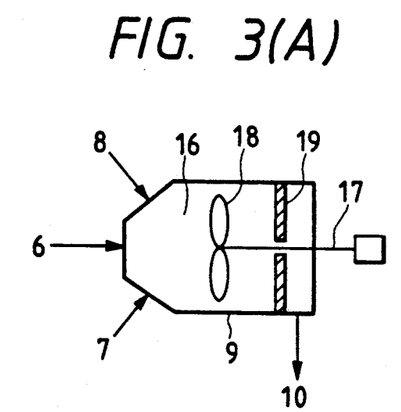
FIGS. 3(A), (B), and (C) are schematic sectional views showing alternative embodiments of the mixer for use in this invention.
Figure 3B:
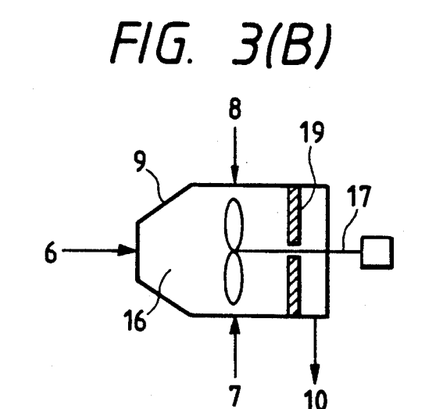
Figure 3C:
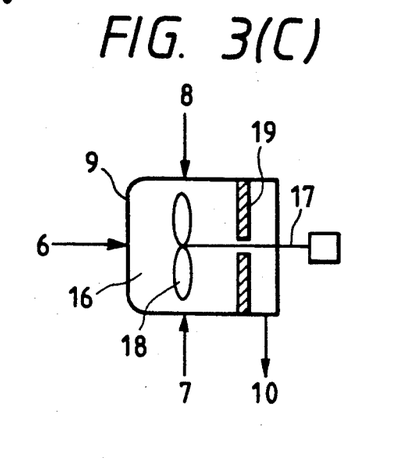
Figure 4A:
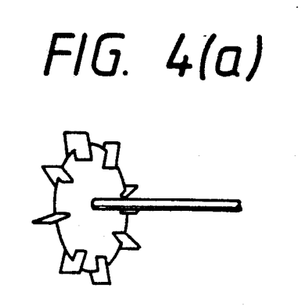
FIGS. 4(a)-(g) are perspective views showing various kinds of high-speed stirring blades of the mixer in this invention.
Figure 4B:
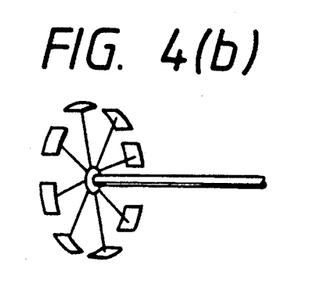
Figure 4C:
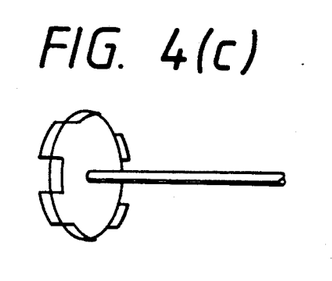
Figure 4D:
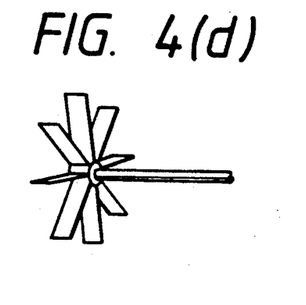
Figure 4E:
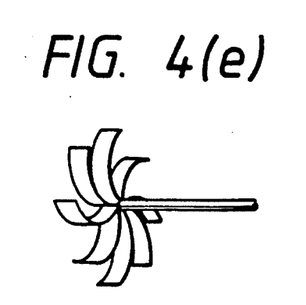
Figure 4F:
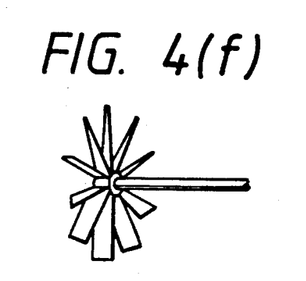
Figure 4G:
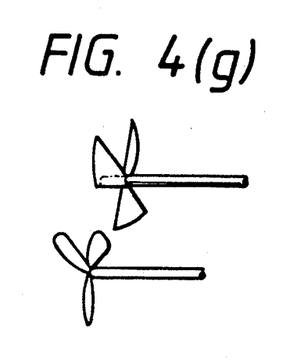

FIG. 3(A), (B), and (C) show schematic views of three examples of the reaction chamber of the mixer of this invention.

In the reaction chamber shown by FIG. 3(A), the inlet conduit 6 of an aqueous protective colloid solution for dilution and the inlet conduits 7 and 8 of an aqueous silver salt solution and an aqueous halide solution are formed at the front of the reaction chamber of mixer 9 so as to be sucked by a rotating blade 18 disposed on a rotary shaft 17. Thus, the aqueous silver salt solution and the aqueous halide solution are prevented from being reacted with each other at high concentrations thereof by the stream of the aqueous protective colloid solution entering from the inlet conduit 6. After being diluted, the aforesaid two solutions are completely reacted with each other when they are intermingled by the blade 18 and passed therethrough.

Also, in the reaction chamber shown by FIG. 3(B), the inlet conduits 7 and 8 of an aqueous silver salt solution and an aqueous halide solution are formed such that these solutions added through the inlet conduits directly strike the rotating blade, are instantly diluted with an aqueous protective colloid solution ejected from the inlet conduit 6, and are quickly reacted with each other after being released from the blade.

In the reaction chamber shown by FIG. 3(C), the space of the reaction chamber in front of the stirring blade 18 is narrowed to prevent an aqueous silver salt solution and an aqueous halide solution added to the chamber from inlet conduits 7 and 8 from returning back into the space and the solutions are instantly diluted with an aqueous protective colloid solution ejected from an inlet conduit 6 by being intermingled by the rotating blade 18.

In addition, the numeral 10 in FIG. 3 shows an outlet of the mixer and the solution containing fine silver halide grains formed in the mixer is immediately discharged therefrom and introduced into a reaction vessel 11. Also, a buffer plate 19 is disposed in each of the mixers 9 in FIG. 3(A), (B), and (C) for sending the reaction mixture to a reaction vessel in an orderly fashion. Furthermore, when the inlet conduit of an aqueous protective colloid is formed such that the solution ejected therefrom is directed toward the extension line of the rotary shaft 17 as shown in FIG. 3, the aqueous protective colloid solution enters the interface between an aqueous silver salt solution and an aqueous halide solution supplied to the mixer by the suction force of the stirrer and the aqueous silver salt solution and the aqueous halide solution are diluted with the aqueous protective colloid solution when these solutions spread on all sides from the ends of the stirring blade by the centrifugal force. Thereafter, these solutions are reacted with each other.

In addition, for the blade or propeller of the stirrer, various kinds of blades as shown in FIG. 4(a)-(g) can be used in this invention. In particular, there are shown a disc turbine 4(a), edged turbines 4(b) and 4(c), a paddle 4(d), a curved paddle 4(e), a slant paddle 4(f), and two propellers which have different shaped tips (i.e., one having arc-shaped tips and one having rounded tips) 4(g).

By the apparatus of this invention for forming silver halide grains, stirring in the reaction chamber of the mixer can be efficiently performed, thereby silver halide grains having a completely homogeneous grain size distribution and a completely homogeneous halogen composition can be obtained.

Thus, according to this invention, the following results are obtained.

(1) Silver halide grains having a completely homogeneous halogen distribution as compared with silver halide grains formed by supplying an aqueous silver halide solution, an aqueous halide solution, and an aqueous protective colloid solution by conventional apparatus are obtained.

(2) The silver halide grains formed have less fog.

(3) A silver halide emulsion excellent in sensitivity, gradation, graininess, sharpness, storage stability, and pressure resistance is obtained.

What is claimed is:

1. An apparatus for forming silver halide grains comprising:

a reaction vessel for causing a nucleus formation and a crystal growth of silver halide grains;

a mixer disposed outside of the reaction vessel and having a high-speed stirrer;

means for supplying an aqueous solution of a water-soluble silver salt, an aqueous solution of a water-soluble halide, and an aqueous protective colloid solution to the mixer while controlling the rotational speed of the high-speed stirrer of the mixer to form fine silver halide grains; and a conduit for connecting the mixer to the reaction vessel for immediately supplying the fine grains in the mixer to the reaction vessel, wherein said means for supplying the aqueous protective colloid solution to the mixer includes a first inlet conduit that is directed onto one of a rotary axis of the high-speed stirrer and an extension line of the rotary axis, further wherein said means for supplying the aqueous silver salt solution and the aqueous halide solution to the mixer includes second and third inlet conduits disposed at opposite sides of the mixer with respect to each other, with the rotary axis of the high-speed stirrer extending between the second and third inlet conduits.

2. An apparatus for forming silver halide grains according to claim 1, further wherein the high-speed stirrer is one of a disc turbine, an edged turbine, a paddle, a curved paddle, a slant paddle and a propeller.

3. An apparatus for forming silver halide grains according to claim 1, further wherein each of the first, second and third inlet conduits includes a flow meter and a pump therein for controlling the supply of the aqueous protective colloid solution, the aqueous solution of water-soluble silver salt and the aqueous solution of water-soluble halide, respectively, to the mixer.

* * * * *